US011152538B1

(12) United States Patent
Montgomery et al.

(10) Patent No.: US 11,152,538 B1
(45) Date of Patent: Oct. 19, 2021

(54) HIGH ON-AXIS BRIGHTNESS AND LOW COLOR SHIFT QD-LED PIXEL

(71) Applicant: SHARP KABUSHIKI KAISHA, Sakai (JP)

(72) Inventors: David James Montgomery, Bampton (GB); Tim Michael Smeeton, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 36 days.

(21) Appl. No.: 16/840,261

(22) Filed: Apr. 3, 2020

(51) Int. Cl.
| H01L 51/52 | (2006.01) |
| H01L 27/32 | (2006.01) |
| H01L 33/08 | (2010.01) |
| H01L 33/06 | (2010.01) |
| H01L 33/14 | (2010.01) |

(52) U.S. Cl.
CPC .......... *H01L 33/06* (2013.01); *H01L 27/3246* (2013.01); *H01L 33/08* (2013.01); *H01L 33/14* (2013.01); *H01L 51/5268* (2013.01); *H01L 51/5271* (2013.01)

(58) Field of Classification Search
CPC ......... H01L 33/06; H01L 33/08; H01L 33/14; H01L 51/5284; H01L 27/3248; H01L 33/60; H01L 27/32; H01L 32/3246; H01L 51/50; H01L 51/56
See application file for complete search history.

(56) References Cited

U.S. PATENT DOCUMENTS

| 7,091,658 B2 | 8/2006 | Ito et al. |
| 7,902,750 B2 | 3/2011 | Takei et al. |
| 8,207,668 B2 | 6/2012 | Cok et al. |
| 8,894,243 B2 | 11/2014 | Cho et al. |
| 9,029,843 B2 | 5/2015 | Harada et al. |
| 9,312,519 B2 | 4/2016 | Yamamoto |
| 9,583,727 B2 | 2/2017 | Cho et al. |

(Continued)

FOREIGN PATENT DOCUMENTS

| CN | 106876566 A | 6/2017 |
| KR | 20150020140 A | 2/2015 |
| WO | 2017/205174 A1 | 11/2017 |

OTHER PUBLICATIONS

Lee et al.,"Three Dimensional Pixel Configurations for Optical Outcoupling of OLED Displays—Optical Simulation", Proceedings SID Display Week 2019, published 2019.

*Primary Examiner* — Savitri Mulpuri
(74) *Attorney, Agent, or Firm* — ScienBiziP, P.C.

(57) ABSTRACT

A light emitting structure comprises a substrate, a sub-pixel stack over a surface of the substrate, and a bank surrounding the sub-pixel stack on the substrate. The light emitting structure also comprises a first filler material in the interior space, and a second filler material over the first filler material. The sub-pixel stack emits a first emission peak along an on-axis direction substantially normal to a top surface of the stack and emits a second emission peak along an off-axis direction at an angle to the on-axis direction. The first emission peak is emitted through an interface between the first filler material and the second filler material substantially without total internal reflection. The second emission peak is totally internally reflected by the interface before reaching a sloped sidewall of the bank and is emitted along the on-axis direction.

20 Claims, 6 Drawing Sheets

(56) References Cited

U.S. PATENT DOCUMENTS

| | | |
|---|---|---|
| 10,090,489 B2 | 10/2018 | Uchida et al. |
| 10,826,010 B1 * | 11/2020 | Montgomery ........ H01L 51/504 |
| 10,930,888 B2 * | 2/2021 | Montgomery ...... H01L 51/5004 |
| 11,038,150 B1 * | 6/2021 | Montgomery ...... H01L 51/5271 |
| 2006/0158098 A1 | 7/2006 | Raychaudhuri et al. |
| 2015/0084012 A1 | 3/2015 | Kim et al. |
| 2017/0133443 A1 * | 5/2017 | Nendai ............... H01L 51/5206 |
| 2018/0190748 A1 * | 7/2018 | Im ....................... H01L 27/3248 |

* cited by examiner

HIGH ON-AXIS BRIGHTNESS AND LOW COLOR SHIFT QD-LED PIXEL

FIELD

The present disclosure generally relates to layers and bank structures used for emissive devices, in particular for Quantum Dot LED displays. In particular, the present disclosure seeks to improve efficiency, reduce color shift, and improve on-axis brightness for top emitting structures embedded in a high refractive index encapsulate material surrounded by a bank.

BACKGROUND

An Organic Light Emitting Diode (OLED) is among the most prevalent LEDs used in a display device while quantum dots are proposed as an improvement to OLEDs as they have better spectral emission and are chemically more stable. Quantum dots are often used as phosphors for blue LEDs and exist as backlight for Liquid Crystal Displays (LCDs). Conventional LED displays take a refining approach with cavities in the LED structure and their effect on light. For example, Kodak (US20060158098) describes a top emitting structure and Samsung (U.S. Pat. No. 9,583,727) describes an OLED and QLED structure with light emitting regions between reflective areas, one of which is partially transmitting.

Other displays involve methods to improve luminance of cavities in LEDs. For example, Samsung (US2015/0084012) describes the use of dispersive layers in an OLED structure, Samsung (U.S. Pat. No. 8,894,243) describes the use of microstructure scattering to improve efficiency, and 3M (WO2017/205174) describes enhancement of light emission by use of surface plasmon nanoparticles or nanostructures in transport layers.

Methods that involve modifications to a cavity (or cavities) are often difficult to implement as they require very small size features or control of layers. One alternative to modifying the cavity is to use a thick top "filler" layer with a high refractive index, which enables reduction in Fresnel reflections and increases in transmissivity through a top electrode. However, the light in a high index layer may be mostly trapped by total internal reflection (TIR). To extract the trapped light, reflective and/or scattering banks surrounding the filler layer are used to out-couple light that is trapped by TIR.

TCL (CN106876566) and JOLED (U.S. Pat. No. 9,029,843) describe such a pixel arrangement with banks and a filler material above the organic layers of the cavity and between the banks. Hitachi (U.S. Pat. No. 7,091,658) describes banks that can be reflective using electrode metallic material, Cambridge Display Tech (KR1020150020140) describes banks that can be shaped in different structures using different assembly steps, and Sharp (U.S. Ser. No. 10/090,489) describes a shaped reflector underneath the organic layers.

Another approach is to control filler materials. For example, Global OLED (U.S. Pat. No. 8,207,668) describes filler layers that can be controlled, where the fillers and organic layers have different thicknesses for different sub pixels, in order to maximize the light output as a function of wavelength.

Another approach is to control the organic layers, which can be achieved by appropriate material choices (e.g., lyophilic/Lyophobic). For example, Seiko Epson (U.S. Pat. No. 7,902,750) describes the cavity layers being curved but the encapsulation is a planarizing layer and JOLED (U.S. Pat. No. 9,312,519) describes the organic layers both being convex and concave in orthogonal directions.

In yet another approach, Lee et al. ("Three Dimensional Pixel Configurations for Optical Outcoupling of OLED Displays—Optical Simulation", Proceedings SID Display Week 2019) describes simulations of pixel banks structures with the design of an OLED emission layer. Such approach simulates optimum extraction efficiencies with bank structures that maximize efficiency for real bank structures. The optimum solution involves only green light and an ITO electrode, which would not be practical in such a device as the emission spectrum would be too broad, and thus have an inferior color gamut while On-axis brightness (apparent brightness to the user) is not considered.

CITATION LIST

U. S. Pub. No. US 2006/0158098 A1 (Eastman Kodak Company, published Jul. 20, 2006).
U.S. Pat. No. 9,583,727 B2 (Samsung Display Co Ltd, issued Feb. 28, 2017).
U.S. Pub. No. US 2015/0084012 A1 (Samsung Display Co Ltd, published Mar. 26, 2015).
U.S. Pat. No. 8,894,243 B2 (Samsung Corning Precision Materials Co Ltd, issued Nov. 25, 2014).
International Pub. No. WO2017/205174 A1 (3M Innovative Properties Company, published Nov. 30, 2017).
Chinese Pub. No. CN106876566 A (TCL, published Jun. 20, 2017).
U.S. Pat. No. 9,029,843 B2 (JOLED Inc., issued May 12, 2015).
U.S. Pat. No. 7,091,658 B2 (Hitachi, issued Aug. 15, 2006).
KR1020150020140 (Cambridge Display Tech, published Feb. 25, 2015).
U.S. Pat. No. 10,090,489 B2 (Sharp Kabushiki Kaisha, issued Oct. 2, 2018).
U.S. Pat. No. 8,207,668 B2 (Global OLED Technology LLC, issued Jun. 26, 2012).
U.S. Pat. No. 7,902,750 B2 (Seiko Epson Corporation, issued Mar. 8, 2011).
U.S. Pat. No. 9,312,519 B2 (JOLED Inc, issued Apr. 12, 2016).
Lee et al. ("Three Dimensional Pixel Configurations for Optical Outcoupling of OLED Displays—Optical Simulation", Proceedings SID Display Week 2019, published 2019).

SUMMARY

The present disclosure is directed to an emissive display involving a quantum dot electro-emissive material in an LED arrangement.

In accordance with one aspect of the present disclosure, a light emitting structure comprises a substrate, a sub-pixel stack over a surface of the substrate, a bank surrounding the sub-pixel stack and forming an interior space above the sub-pixel stack, a first filler material in the interior space and having a first refraction index, and a second filler material over the first filler material and having a second refractive index lower than the first refractive index, and an interface between the first filler material and the second filler material, wherein the sub-pixel stack emits a first emission peak into the first filler material along an on-axis direction substantially normal to a top surface of the sub-pixel stack and emits a second emission peak into the first filler material along an off-axis direction at an angle to the on-axis direction, the first emission peak is emitted through the interface substantially without total internal reflection, the second emission peak is totally internally reflected by the interface before reaching a sloped sidewall of the bank, and the second emission peak is reflected by the sloped sidewall and emitted through the interface along the on-axis direction without substantial total internal reflection.

In some implementation, the sub-pixel stack comprises an emissive layer between a first transport layer and a second transport layer, a first electrode layer coupled to the first transport layer; and a second electrode layer coupled to the second transport layer.

In some implementation, the sub-pixel stack is configured to emit light in a plurality of wavelengths having a central wavelength, the first electrode layer is a bottom reflector having a metallic layer on the substrate, and a distance between the emissive layer and the bottom reflector is predefined so that the sub-pixel stack emits the first emission peak into the first filler material along the on-axis direction and emits the second emission peak into the first filler material along the off-axis direction.

In some implementation, an angle between the sloped sidewall of the bank and the top surface of the sub-pixel stack is one-half the angle between the on-axis direction of the first emission peak and the off-axis direction of the second emission peak.

In some implementation, the sub-pixel stack is configured to emit light in a plurality of wavelengths having a central wavelength, and the first emission peak is more intense than the second emission peak for wavelengths emitted by the sub-pixel stack that are shorter than the central wavelength.

In some implementation, the sub-pixel stack is configured to emit light in a plurality of wavelengths having a central wavelength, and the first emission peak is less intense than the second emission peak for wavelengths emitted by the sub-pixel stack that are longer than the central wavelength.

In some implementation, the second filler material covers an entire top surface of the first filler material.

In some implementation, the second filler material covers a portion of a top surface of the first filler material.

In some implementation, the interface has a sloped angle with respect to the top surface of the sub-pixel stack such that the second emission peak is reflected before reaching the sloped sidewall of the bank.

In some implementation, the emissive layer includes quantum dot emission material, the first transport layer includes a hole transport layer, the second transport layer includes an electron transport layer, the first electrode layer is an anode layer including a metallic reflector for reflecting the light emitted from the emissive layer, and the second electrode layer is a cathode layer including a non-metallic and substantially transparent material.

In some implementation, the second refractive index is substantially the same as the first refractive index.

In some implementation, the first emission peak is emitted through the interface along the on-axis direction in a central region of the light emitting structure, the second emission peak reflected by the sloped sidewall of the bank is emitted through the interface along the on-axis direction in a peripheral region of the light emitting structure; and on-axis brightness is increased and off-axis color shift having an angle is reduced.

In some implementation, the emissive layer includes quantum dot emission material, the first transport layer includes an electron transport layer, the second transport layer includes a hole transport layer, the first electrode layer is a cathode layer having a metallic reflector for reflecting the light emitted from the emissive layer, and the second electrode layer is an anode layer having a non-metallic and substantially transparent material.

In accordance with another aspect of the present disclosure, a display device comprises a light emitting structure. The light emitting structure comprises a substrate, a sub-pixel stack over a surface of the substrate, a bank surrounding the sub-pixel stack and forming an interior space above the sub-pixel stack, a first filler material in the interior space and having a first refraction index, and a second filler material over the first filler material and having a second refractive index lower than the first refractive index, and an interface between the first filler material and the second filler material, wherein the sub-pixel stack emits a first emission peak into the first filler material along an on-axis direction substantially normal to a top surface of the sub-pixel stack and emits a second emission peak into the first filler material along an off-axis direction at an angle to the on-axis direction, the first emission peak is emitted through the interface substantially without total internal reflection, the second emission peak is totally internally reflected by the interface before reaching a sloped sidewall of the bank, and the second emission peak is reflected by the sloped sidewall and emitted through the interface along the on-axis direction without substantial total internal reflection.

In accordance with another aspect of the present disclosure, a sub-pixel structure comprises a sub-pixel stack including an emissive layer between a first transport layer and a second transport layer, a first electrode layer coupled to the first transport layer, and a second electrode layer coupled to the second transport layer, a bank surrounding the sub-pixel stack and forming an interior space above the sub-pixel stack, a first filler material in the interior space and having a first refractive index, a second filler material over the first filler material and having a second refractive index lower than the first refractive index, and an interface between the first filler material and the second filler material, wherein the sub-pixel stack is configured to emit light in a plurality of wavelengths having a central wavelength, a distance between the emissive layer and the first electrode layer is predefined so that the sub-pixel stack emits a first emission peak into the filler material along an on-axis direction substantially normal to a top surface of the sub-pixel stack and emits a second emission peak into the filler material along an off-axis direction at an angle to the on-axis direction, the first emission peak is emitted through the interface substantially without total internal reflection, the second emission peak is completely internally reflected by the interface onto a sloped sidewall of the bank and the second emission peak is reflected by the sloped sidewall and emitted through the interface along the on-axis direction substantially without total internal reflection.

In some implementation, the first emission peak is more intense than the second emission peak for wavelengths emitted by the sub-pixel stack that are shorter than the central wavelength.

In some implementation, the first emission peak is less intense than the second emission peak for wavelengths emitted by the sub-pixel stack that are longer than the central wavelength.

In some implementation, the first emission peak is emitted through the interface along the on-axis direction in a central region of the sub-pixel structure, the second emission peak reflected by the sloped sidewall is emitted through the interface along the on-axis direction in a peripheral region of the sub-pixel structure, and on-axis brightness is increased and off-axis color shift having an angle of the sub-pixel structure is reduced.

In some implementation, the second filler material covers at least a portion of a top surface of the first filler material.

In some implementation, the interface has a sloped angle with respect to the top surface of the sub-pixel stack such that the second emission peak is reflected before reaching the sloped sidewall of the bank.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

DETAILED DESCRIPTION

Figure 1A:
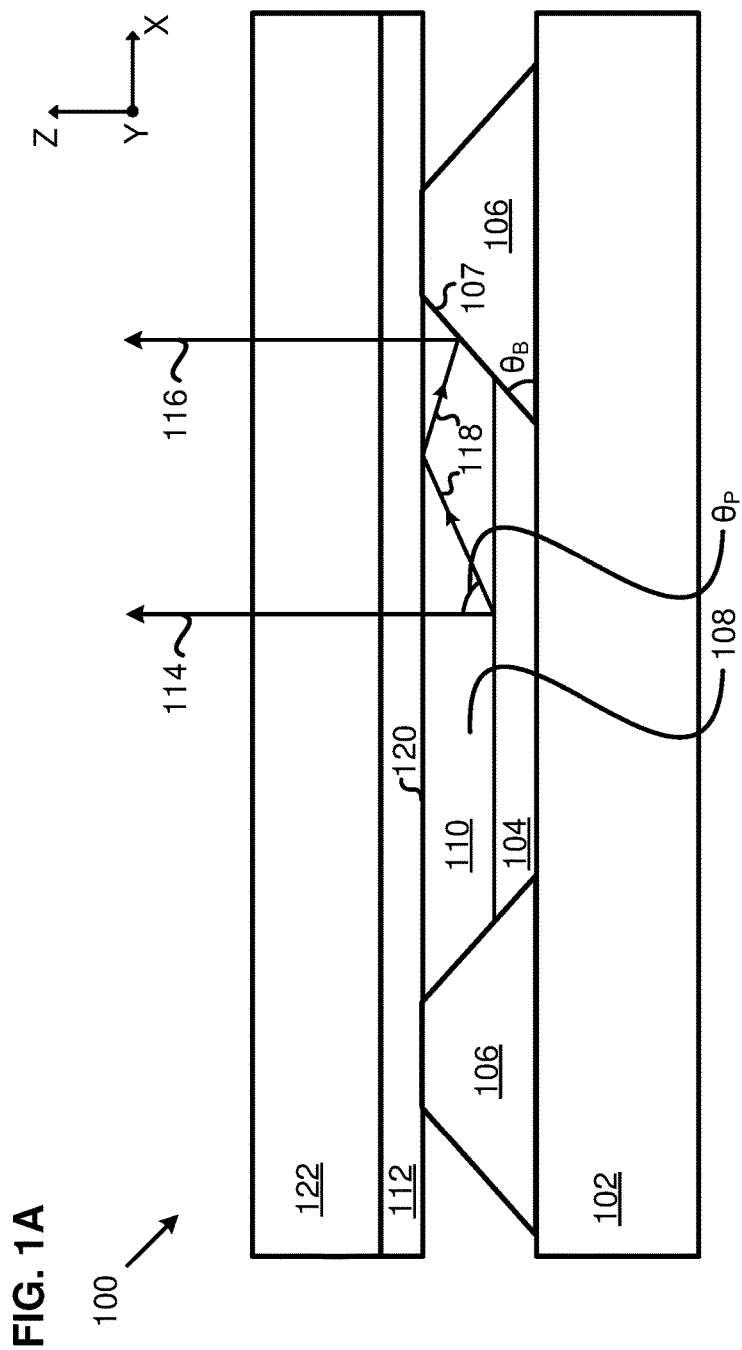
FIG. 1A is a schematic cross-sectional view of a portion of an example light emitting structure in accordance with an example implementation of the present disclosure.

The following disclosure contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "comprising" means "including, but not necessarily limited to" and specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standard, and the like are set forth for providing an understanding of the described technology. In other examples, detailed description of well-known methods, technologies, systems, architectures, and the like are omitted so as not to obscure the description with unnecessary details.

The present disclosure relates to an emissive display involving a quantum dot electro-emissive material in a light emitting diode (LED) arrangement. The LED arrangement typically includes a layer of quantum dot (QD) emission material (e.g., emissive layer) sandwiched between an electron transport layer (ETL) and a hole transport layer (HTL). The three layers are sandwiched between two conductive layers to form a sub-pixel stack. In one or more implementations of the present disclosure, a "top" emitting (TE) structure is used. The TE structure involves light emission from a side of the TE structure opposite a glass substrate on which the TE structure is disposed.

In one or more implementations of the present disclosure, fabrication of a TE device involves one thick layer of conductive reflective material, typically, made of a metal (e.g., silver or aluminium) deposited on the glass substrate with the HTL layer on the conductive reflective layer (e.g., a reflective conductor or reflective electrode), the emissive layer on the HTL layer, the ETL layer on the emissive layer, and a transparent electrode layer on the ETL layer. In one preferred implementation, the reflective electrode has a thickness greater than 80 nm (i.e., $10^{-9}$ meters). In another preferred implementation, the reflective electrode includes a layer of silver having a thickness of approximately 100 nm and a layer of Indium Tin Oxide (ITO) having a thickness of approximately 10 nm. In one preferred implementation, the HTL layer is made of a layer of PEDOT:PSS (poly(3,4-ethylenedioxythiophene) polystyrene sulfonate) approximately 40 nm thick and a layer of TFB (poly(9,9'-dioctylfluorene-co-bis-N,N'-(4-butylphenyl)diphenylamine)) having a thickness of approximately 35-45 nm on the PEDOT:PSS layer. In another preferred implementation, an approximately 20 nm thick emissive layer is disposed on the HTL layer and the ETL layer is disposed on the emissive layer. In another preferred implementation, the ETL layer is made of Zinc Oxide (ZnO) nanoparticles and has a thickness of approximately 30-80 nm. In one preferred implementation, the transparent electrode layer is a thin metal layer thick enough to carry sufficient current yet thin enough to be transparent to light and disposed on the ETL layer. In one preferred implementation, the transparent electrode layer is an ITO layer having a thickness of approximately 80 nm.

In one or more implementations of the present disclosure, angular emission distributions from the emissive layer can be determined by a distance between the emissive layer and the reflective electrode layer (e.g., at the bottom of the sub-pixel stack) and the distance is directly dependent on a total thickness of the HTL layer. The distance between the emissive layer and the reflective electrode layer may be tuned such that there are two directions of light emissions from the light source where constructive interference occurs. One direction is an on-axis emission (e.g., emission normal to a plane, or a top surface, of the sub-pixel stack) and the other direction is an off-axis emission (e.g., emission is at an angle with respect to the on-axis direction).

In an example implementation where the reflective electrode is a perfect mirror, the reflective electrode layer is at a distance of a wavelength (e.g., $\lambda$) apart from the emissive layer. The distance may be 0.5, 1, or any integer with a multiple of 0.5 wavelength apart from the emissive layer. In an example implementation where the reflective electrode is not a perfect mirror (e.g., in other words a phase shift exists), a point of reflection will not be located exactly at the surface of the reflective electrode. In one or more implementations of the present disclosure, the reflective electrode is, for example, at a distance of about 1 wavelength apart from the emissive layer in order generate two emissions (e.g., on-axis and off-axis emissions). However, in order to offset the effects of the phase shift in the reflective electrode, the distance is adjusted to 0.87 wavelength. The emissive layer may generate a constructive on-axis emission normal to the reflective electrode and an off-axis emission at approximately 50° off-axis with respect to the on-axis emission such that a thickness of the HTL layer may be obtained.

The correlation described previously between the distance, thickness, angular emissions, and wavelength may be represented by the following equations:

$$2(d-d')\cos(\theta_P)=N\lambda \quad \text{Equation (1)}$$

$$d=T \quad \text{Equation (2)}$$

where d is a sum of all optical thicknesses of all layers (e.g., 104d1 and 104d2 in FIG. 1B) in the HTL layer, d' is an optical distance from a top surface of the reflective electrode to an interior portion of the reflective electrode where effective reflection takes place (e.g., d' in FIG. 1B), $\theta_P$ is an angle between the on-axis emission and the off-axis emission (e.g., FIG. 1A), N is an integer greater than zero, $\lambda$ is wavelength in free space, and T is a total thickness of the HTL layer which may include one or more layers (e.g., TFB layer and PEDOT:PSS layer) with each layer having a different refractive index. With Equations (1) and (2), the thickness T can be tuned accordingly. In an example implementation, N may equal to 1 to give a broad forward emission direction. In a preferred example implementation, N may equal to 2 if d is predetermined and $\theta_P$ equals to 0 (e.g., d−d'=$\lambda$). As such, if $\cos(\theta_P)$ equals to ½ (e.g., $\theta_P$ is) 60°, a second peak may be generated. Due to the difference in refractive indices between various elements (e.g., HTL layer, filler layer, etc.) of the present disclosure, $\theta_P$ is less than 60° in one preferred implementation, and $\theta_P$ is about 50°-55° in yet another preferred implementation). The term "emission" described in the present disclosure may refer to a distribution of wavelengths emitted, but is not limited to a single wavelength. The term "wavelength" in the present disclosure may be used to describe a peak or central wavelength amongst the plurality of wavelengths in the context of equations above, but is not limited to the description provided herein.

The present disclosure is not limited to the provided examples as the essential principle of the disclosed structure still applies if the arrangement of the ETL and HTL layers are reversed. In one preferred implementation of the present disclosure the transport layer is thinner than the transport layer disposed closer to the glass substrate regardless of whether the ETL layer or the HTL layer is disposed on the emitting side of the emissive layer away from the glass substrate.

The example implementations of the present disclosure may be related to QLED structures. However, the present disclosure is not limited only to QLED structures and may be applicable to various implementations related to OLED structures.

In QLED sub-pixels, an interior space structure (e.g., a cavity structure) may be outlined by a sub-pixel stack and a bank structure surrounding the sub-pixel stack. A filler material with higher refractive index may be disposed in the interior space structure above the sub-pixel stack. The bank structure may have a height that is, at least, the same as or higher than the filler material with high refractive index. The bank structure may also be lower in height with respect to the filler material in some implementations. The filler material with higher refractive index may extract more light from the interior space than a layer directly above the filler material with low refractive index. The low refractive index layer is disposed over the filler material to prevent optical crosstalk by preventing light from being coupled to the neighbouring pixels by an upper glass layer disposed above the low refractive index layer. The low refractive index layer traps light in the filler material that is more readily absorbed. Therefore, light can be extracted more effectively from the filler material without coupling light into the upper glass layer. In one or more implementations, the low refractive index layer may be at least one of an air gap, siloxane based nano-composite polymers from Inkron with refractive index as low as 1.15, Poly(1,1,1,3,3,3-hexafluoroisopropyl acrylate) with a refractive index of 1.375, and Poly(2,2,3,3,4,4,4-heptafluorobutyl acrylate) with a refractive index of 1.377.

In the present disclosure with the interior space structure and the top transparent electrode, a distance between the emissive layer and the reflective electrode is tuned as described previously such that there are on-axis emissions and off-axis emissions. The off-axis emissions will be reflected onto the top surface (e.g., an interface) of the filler material via total internal reflection (TIR) at least once before being reflected off a sloped-surface of the bank and emitted through the filler material along the on-axis direction. The bank structure at ends of each pixel is designed such that a sloped angle of the bank structure (e.g., bank angle) is one-half an angle of an off-axis emission into the filler material relative to the on-axis emission.

In the present disclosure, the emissive layer in the sub-pixel stack may emit light in a range of wavelengths having one central wavelength that is typically taken as the main emission peak. The central wavelength is the wavelength of the highest spectral brightness in the emission spectrum from the light emission source. In the present disclosure, for wavelengths emitted by the emissive layer that are longer on average than the central wavelength, a stronger intensity off-axis emission than the on-axis emission is produced. The on-axis emission is stronger in intensity than the off-axis emission for wavelengths shorter than the central wavelength.

According to the present disclosure, on-axis brightness is maximized as well as the brightness perceived by the user even if total light output efficiency is not maximized. Since light of the on-axis emission is generally perceived by a user at a central area of a pixel and light of the off-axis emission is generally perceived at edges of a bank, a distribution of light from these different spectral areas may provide a more balanced color distribution at all angles, thereby minimising color shift at various angles.

FIG. 1A is a schematic cross-sectional view of a portion of an example light emitting structure in accordance with an example implementation of the present disclosure. In FIG. 1A, an example structure 100 may include a substrate 102, a sub-pixel stack 104, a bank 106, a first filler material 110, a second filler material 112, and a glass cover 122. In one or more implementations of the present disclosure, the first filler material 110 may be a higher refractive index material, and the second filler material 112 may be a lower refractive index material relative to the first filler material 110. The sub-pixel stack 104 may be disposed on the substrate 102 with the bank 106 surrounding the sub-pixel stack 104 to form an interior space 108 above the sub-pixel stack 104. In one implementation, the example structure 100 may include a pixel structure.

In the present implementation as shown in FIG. 1A, the first filler material 110 may be disposed in the interior space 108 that is formed by the bank 106 surrounding the sub-pixel stack 104. The second filler material 112 may be disposed continuously over the first filler material 110 and the bank 106.

In another implementation, the second filler material 112 may be partially disposed on the first filler material 110. In one or more implementations, the bank 106 may be greater in thickness than the thickness of the first filler material 110. In one or more implementations, the bank 106 is in contact with the substrate 102. In a preferred implementation, the bank 106 may be in contact or almost in contact with the second filler material 112. In one or more implementations, the glass cover 122 may be disposed continuously over the second filler material 112.

In one or more implementations, light is emitted from the sub-pixel stack 104 through the first filler material 110, the second filler material 112, and the glass cover 122. The first filler material 110 may have a higher refractive index than air so that the first filler material 110 may extract light from the sub-pixel stack 104 to a greater extent than air as a filler material. Light trapped in the sub-pixel stack 104 may be quickly absorbed while light trapped in the first filler material 110 may propagate to edges of the bank 106 and be extracted by reflection.

In one or more implementations, the first filler material 110 may have a higher refractive index than those of the sub-pixel stack 104 and the second filler material 112. In one implementation, the second filler material 112 (e.g., a lower refractive index layer) may be an air gap. In one or more implementations, the bank 106 may be opaque. A surface of the bank 106 facing the first filler materials 110 may be scattering reflective or specular reflective, and may be at an angle (e.g., sloped) with respect to the plane of the substrate 102 (e.g. a glass substrate).

Figure 1B:
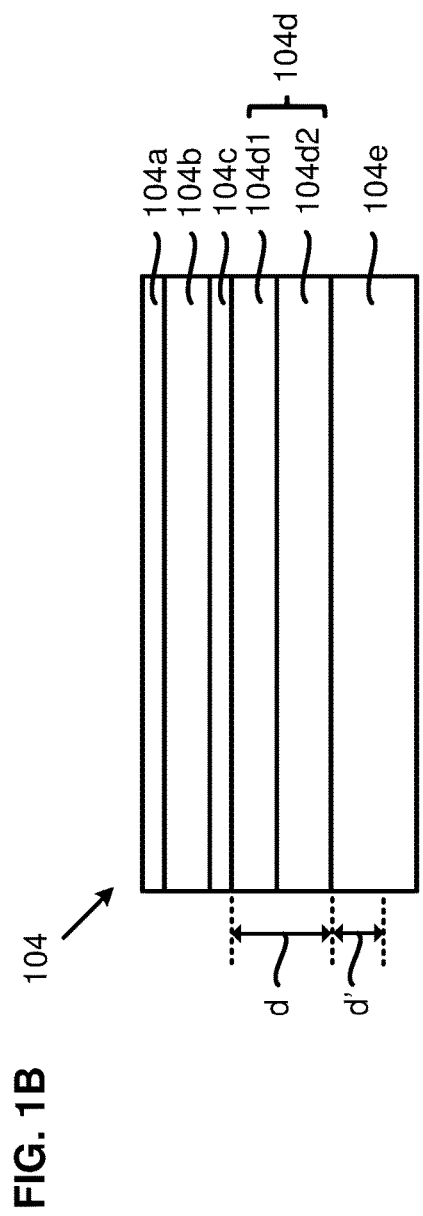
FIG. 1B is a schematic cross-sectional view of a portion of the sub-pixel stack in the light emitting structure of FIG. 1A in accordance with an example implementation of the present disclosure.

FIG. 1B is a schematic cross-sectional view of a portion of the sub-pixel stack in the light emitting structure of FIG. 1A in accordance with an example implementation of the present disclosure. As shown in FIG. 1B, the sub-pixel stack 104 includes a first electrode layer 104a, an ETL layer 104b, an emissive layer 104c, an HTL layer 104d, and a second electrode layer 104e.

In one example implementation, with reference to FIGS. 1A and 1B, the first filler material 110 may be disposed on the first electrode layer 104a of the sub-pixel stack 104 and the refractive index of the first electrode layer 104a may be substantially the same as the refractive index of the first filler material 110. In the present implementation, the first electrode layer 104a may be a transparent top electrode and the second electrode layer 104e may be a bottom reflective electrode. The first electrode layer 104a may be a cathode layer that is non-metallic, substantially transparent, and disposed on the ETL layer 104b. The second electrode layer 104e may be disposed on the substrate 102 and may be an anode layer that is a metallic reflector reflecting light emitted from the emissive layer 104c.

However, the arrangement of the first electrode layer 104a and the second electrode layer 104e is not limited to the examples provided herein and may be reversed. For example, the first electrode layer 104a may be a bottom anode layer that is a metallic reflector reflecting light emitted from the emissive layer 104c and the second electrode layer 104e may be a top cathode layer that is non-metallic and substantially transparent.

As shown in FIG. 1B, the HTL layer 104d may include a TFB layer 104d1 and a PEDOT:PSS layer 104d2. In another implementation, the HTL layer 104d may include other layers and is not limited to the example layers provided herein. In another implementation, the previous arrangements of the HTL layer 104d and the ETL layer 104b may be reversed depending on the arrangements of the first electrode layer 104a and second electrode layer 104e.

In one or more implementations of the present disclosure, with reference to FIGS. 1A and 1B, at least one single emission peak is produced from the sub-pixel stack 104. With reference to FIG. 1A, a main portion 114 of the emission peak (hereinafter a first emission peak 114) and other portions 116 of the emission peak (hereinafter a second emission peak 116) may be produced from the sub-pixel stack 104. The first emission peak 114 may be an on-axis emission that is emitted from the emissive layer 104c, normal to a top surface of the emissive layer 104c, through the ETL layer 104b, the first electrode layer 104a, and then through the first filler material 110, the second filler material 112, and the glass cover 122 substantially without total internal reflection.

In one or more implementations of the present disclosure, the second emission peak 116 may be an off-axis emission emitted from the emissive layer 104c and into the first filler material 110 at an off-angle with respect to the first emission peak 114. The off-axis second emission peak 116 may reflect totally and internally at the interface 120 (e.g., the top surface of the first filler material 110) at least once as a total internal reflection (TIR) 118, before reaching a sloped sidewall 107 of the bank 106. The off-axis second emission peak 116 undergone total internal reflection may reflect off the sloped sidewall 107 along the on-axis direction (e.g., at an angle that is normal to the top surface of the emissive layer 104c) and through the interface 120 substantially without total internal reflection.

In one or more implementations, the first emission peak 114 may be emitted through the interface 120 substantially without total internal reflection. In a preferred implementation, a bank angle $\theta_B$ of the sloped sidewall 107 is one-half an off-axis second emission peak angle $\theta_P$ with respect to the on-axis first emission peak 114. With this arrangement, a high on-axis brightness is achieved.

Figure 2B:
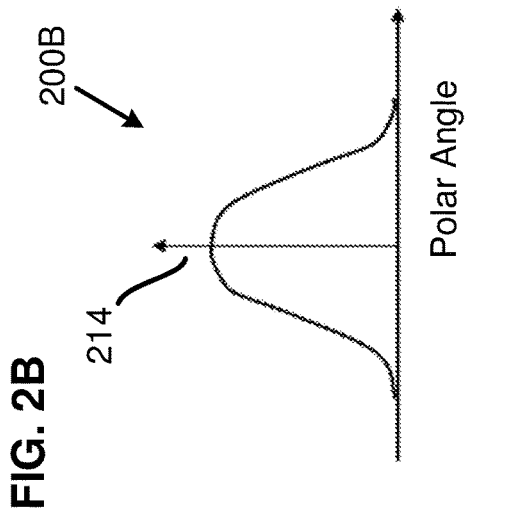
FIG. 2B illustrates an example angular distribution diagram of a single emission peak at one wavelength as measured in the example light emitting structure of FIG. 2A in accordance with an example implementation of the present disclosure.
Figure 2D:
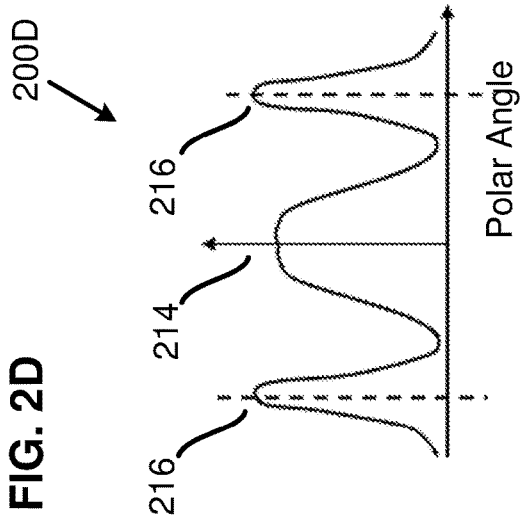
FIG. 2D illustrates example angular distributions of three emission peaks measured in the example light emitting structure of FIG. 2C in accordance with an example implementation of the present disclosure.
Figure 2A:
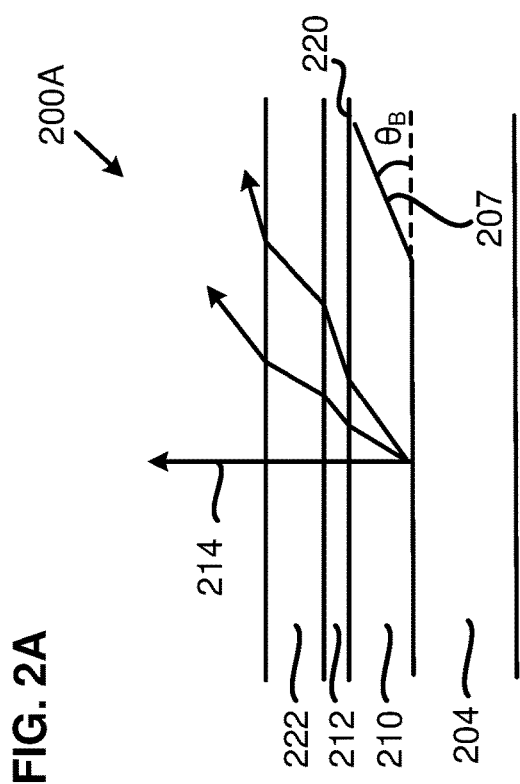
FIG. 2A illustrates a portion of an example light emitting structure in accordance with an example implementation of the present disclosure.

FIG. 2A illustrates a portion of an example light emitting structure in accordance with an example implementation of the present disclosure. FIG. 2B illustrates an example emission distribution diagram of the light emitting structure in FIG. 2A in accordance with an example implementation of the present disclosure.

In FIG. 2A, an example structure 200A may include a sub-pixel stack 204 which emits a plurality of light emissions including at least one single main emission peak, a first filler material 210, a second filler material 212, an interface 220, and a glass cover 222. In one or more implementations, the sub-pixel stack 204, the first filler material 210, the second filler material 212, the interface 220, and the glass cover 222 may correspond to the sub-pixel stack 104, the first filler material 110, the second filler material 112, the interface 120, and the glass cover 122, respectively, of the example structure 100 in FIG. 1A.

In FIG. 2A, the example structure 200A has a first electrode layer that may include a transparent top electrode layer, a second electrode layer that may be a reflective bottom electrode layer, and the interface 220 (e.g., a surface of the first filler material 210). As described above, a single main emission peak is produced by the emissive layer. A main portion 214 of the main emission peak (e.g., the straight arrow in FIG. 2A) passes through the first filler material 210 and second filler material 212 while the other portions of the main emission peak (e.g., other arrows not labelled in FIG. 2A) spread in various angles which leads to lower on-axis brightness.

As described above, the main portion 214 of the main emission peak (e.g., the on-axis emission) is emitted through the filler materials 210, 212 while the other portions of the emission peak (e.g., the off-axis emission) are spread in various angles. The on-axis first emission peak 214 is emitted normal to a top surface of the sub-pixel stack 204 while the off-axis emissions (e.g., other arrows not labelled in FIG. 2A) are emitted into the first filler material 210 at an off-angle with respect to the on-axis emission. In the present implementation, the on-axis emission is a first emission peak 214.

With reference to an example diagram 200B in FIG. 2B, angular distribution of the main emission peak at one wavelength is measured in the first filler material 210 of the example structure 200A in FIG. 2A. The on-axis first emission peak 214 and the off-axis emissions of the main emission peak are illustrated in the angular distribution.

Figure 2C:
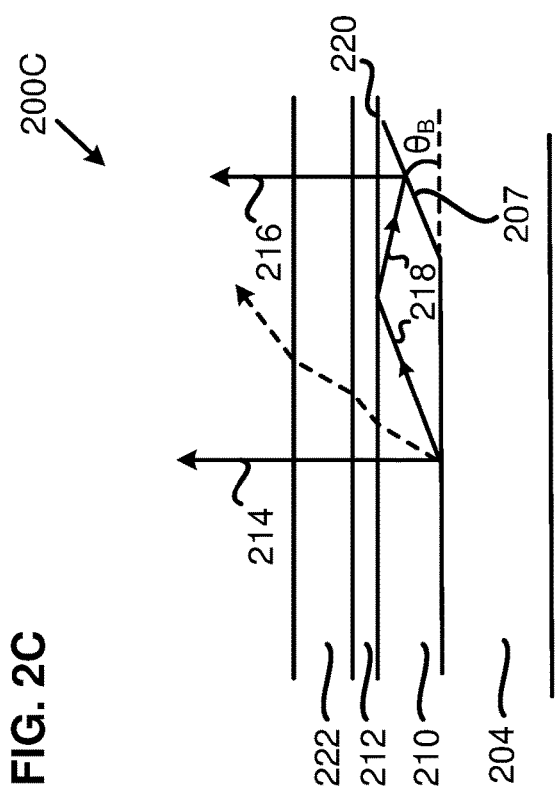
FIG. 2C illustrates a portion of another example light emitting structure in accordance with an example implementation of the present disclosure.

FIG. 2C illustrates a portion of another example light emitting structure in accordance with an example implementation of the present disclosure. FIG. 2D illustrates angular distributions of three emission peaks measured in the first filler material 210 of the example structure 200C in FIG. 2C in accordance with an example implementation of the present disclosure.

In FIG. 2C, the example structure 200C may include a similar structure to that of the example structure 200A in FIG. 2A, Therefore, the details of the example structure 200C are omitted for brevity.

In contrast to the example structure 200A, the interface 220 (e.g., a top surface of the first filler material 210) in the example structure 200C has a higher refractive index. In the example structure 200C, the on-axis first emission peak 214 (e.g., the solid arrow) is emitted from the emissive layer of the sub-pixel stack 204 while the off-axis emissions of the main emission peak (hereinafter second emission peak 216, e.g., the other solid arrow) is emitted from the sub-pixel stack 204 and is totally reflected internally at least once against the interface 220 via total internal reflection 218 before being reflected off a sloped sidewall 207 at an angle that is normal to the top surface of the sub-pixel stack 204.

In one or more implementations of the interface 220 (e.g., a surface of the high refractive index first filler material 210), the second emission peaks 216 may be totally reflected internally against the interface 220 at least once via total internal reflection 218 before being reflected off the sloped sidewall 207 at the normal angle.

With such arrangement, higher on-axis brightness is achieved. In contrast, without the interface 220 (e.g., a surface of the first filler material 210 not having high refractive index), the off-axis emissions (e.g., the dotted line arrow in the example structure 200C) may not be totally reflected internally to the bank but rather may be refracted off the first filler material 210, the second filler material 212, and the glass cover 222, which may result in a reduced on-axis brightness.

With reference to an example diagram 200D in FIG. 2D, angular distributions of three emission peaks are measured in the first filler material 210 of the example diagram 200D in FIG. 2D. The example diagram 200D illustrates the on-axis first emission peak 214 and the off-axis emissions that underwent TIR thus resulting in being two second emission peaks 216 planking the on-axis first emission peak 214.

Figure 3:
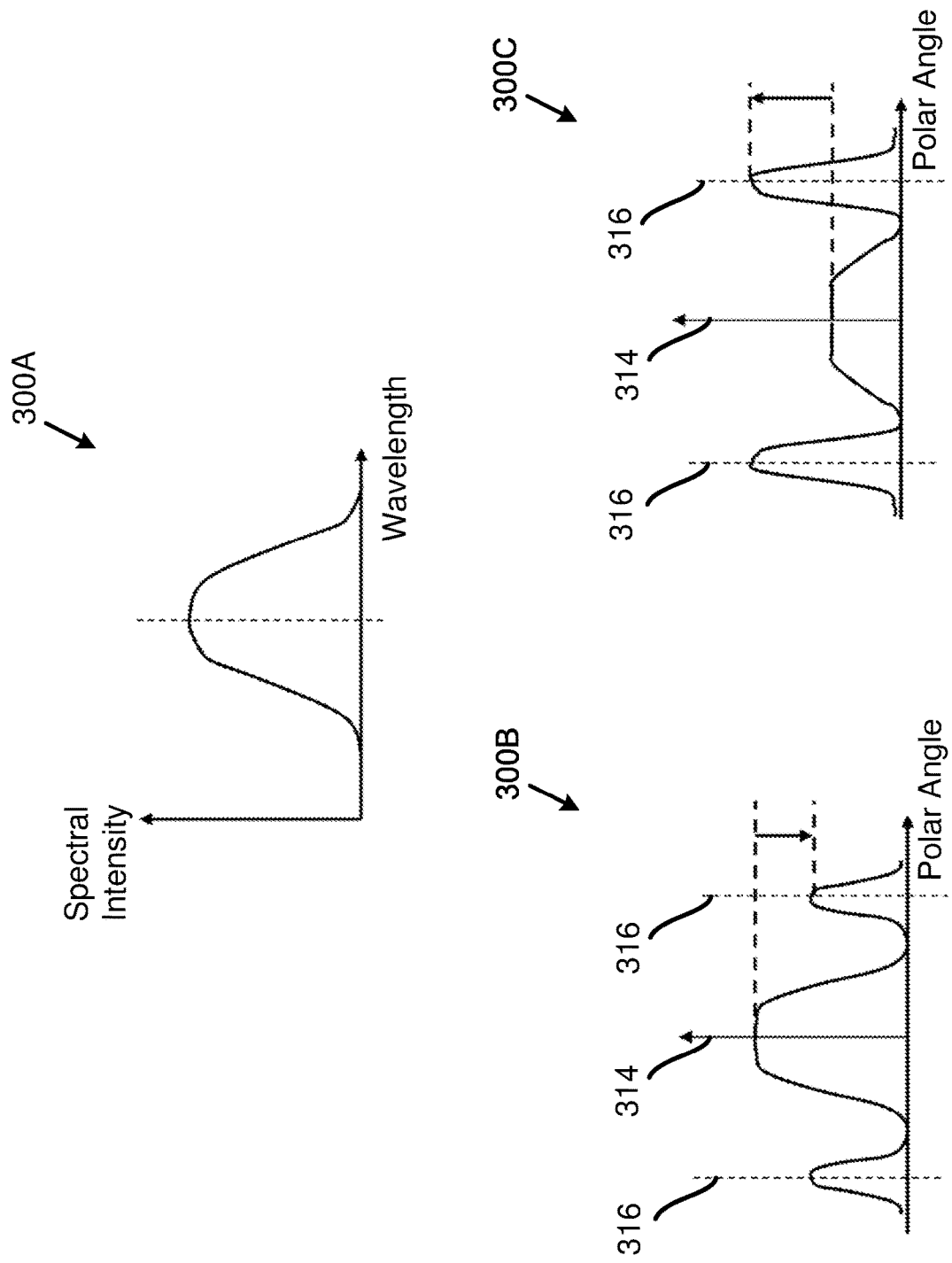
FIG. 3 illustrates example angular distribution diagrams from a light emitting structure in accordance with an example implementation of the present disclosure.

FIG. 3 illustrates example diagrams 300A, 300B, and 300C of angular distribution from a light emitting structure in accordance with an example implementation of the present disclosure. It should be noted that the example diagrams 300A, 300B, and 300C described in FIG. 3 may substantially correspond to the example diagrams 200B and 200D described in FIG. 2. Therefore, the details of the example diagrams 300A, 300B, and 300C are omitted for brevity.

There are bound to be constructive interferences between the light emission peaks. These interferences are wavelength dependent and materials are generally dispersive in their nature towards the propagation of light. Light emissions from the emissive layers follow a finite spectra width in a calculation related to maximising efficiency and on-axis brightness. A high variability of a white point is seen as a function of polar angle. In one or more implementations of the present disclosure, the light emitting structure maximises on-axis brightness and minimises color shift.

In FIG. 3, the example diagram 300A illustrates a real emission spectrum typically having a single central peak (or a primary peak if there are a plurality of peaks). A distance between the emitting layer and the bottom electrode layer is chosen so that the relative intensity of the on-axis and off-axis emissions (e.g., the first emission peak 314 and the second emission peaks 316 in the diagram 300B or 300C) into a filler material (e.g., the high refractive index first filler material) can be controlled.

The example diagrams 300B and 300C in FIG. 3 illustrate that light emitted from a sub-pixel stack has a plurality of wavelengths in which there is a central wavelength. In an example implementation, most of the light emission wavelengths that are emitted by the sub-pixel stack are shorter (e.g., 316 in the example diagram 300B) than the central wavelength (e.g., 314 in the example diagram 300B) while the central wavelength (or the on-axis emission) is spectrally more intense than the shorter wavelengths (or the off-axis emission). In another example implementation, most of the light emission wavelengths emitted by the sub-pixel stack are longer (e.g., 316 in the example diagram 300C) than the central wavelength (e.g., 314 in the example diagram 300C) and the central wavelength (or the on-axis emission) is spectrally less intense than the shorter wavelengths (or the off-axis emission). Since light emissions from the on-axis emission come from a bulk area of a pixel while light from the off-axis emission appears to come from edges of the pixel, light emission may balance out to achieve a low color shift at various angles although each emission may have different spectra.

Figure 4A:
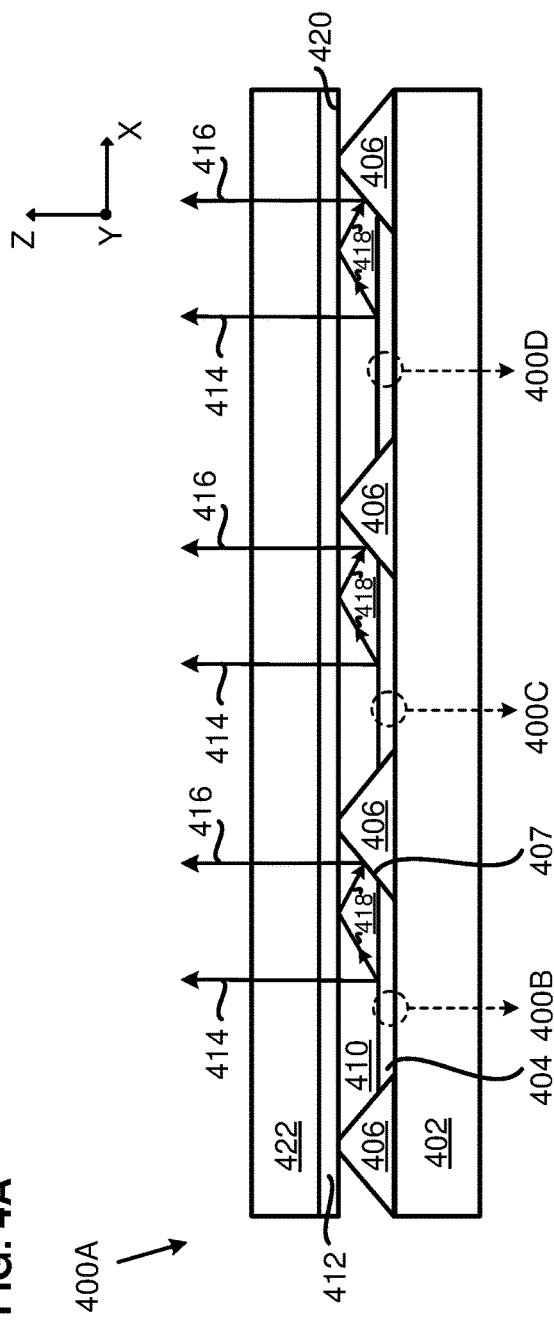
FIG. 4A is a schematic cross-sectional view of an example light emitting structure in accordance with an example implementation of the present disclosure.

FIG. 4A is a schematic cross-sectional view of an example structure 400A of a light emitting structure in accordance with an example implementation of the present disclosure. The example structure 400A in FIG. 4A includes a glass substrate 402, a sub-pixel stack 404, a bank 406, a first filler material 410, a second filler material 412, and a glass cover 422. The example structure 400A may substantially correspond to the example structure 100 described in FIG. 1A. Therefore, the details of the example structure 400A are omitted for brevity.

In FIG. 4A, the example structure 400A differs from the example structure 100 in FIG. 1A since the example structure 400A includes three light emitting structures 400B, 400C, and 400D (e.g., three sub-pixel stacks) for three different pixels. In one or more implementations of the present disclosure, the example structure 400A may include the example structure 400B for a blue pixel, the example structure 400C for a green pixel, and the example structure 400D for a red pixel. In another implementation, the example structure 400A may include more than three example structures for more than three pixels, and is not limited to the described example.

In one or more implementations, a first emission peak 414 is emitted in the on-axis direction through both the first filler material 410 and the second filler material 412 substantially without total internal reflection 418. A second emission peak 416 is emitted from the sub-pixel stack 404 at an off-axis direction towards an interface 420 (e.g., a top surface of the first filler material 410) between the first filler material 410 and the second filler material 412 and is totally internally reflected (e.g., 418) by the interface 420 at least once before being reflected from a sloped sidewall 407 of the bank 406 along the on-axis direction substantially without total internal reflection 418.

Figure 4D:
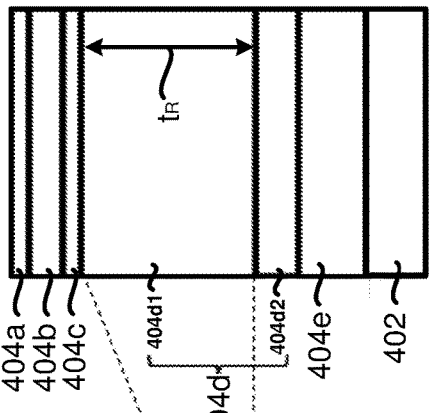
FIG. 4B, FIG. 4C, and FIG. 4D are detailed schematic cross-sectional views of three example structures of three sub-pixel stacks in the light emitting structure of FIG. 4A in accordance with example implementations of the present disclosure.
Figure 4C:
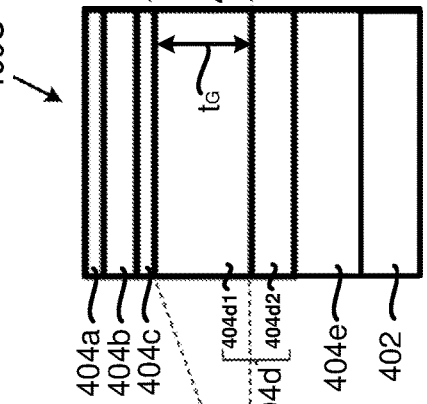
Figure 4B:
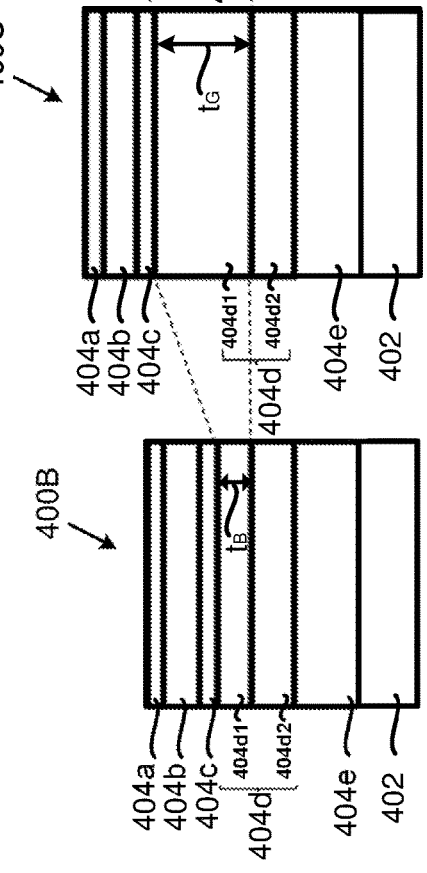

FIGS. 4B, 4C, and 4D are detailed schematic cross-sectional views of three example structures 400B, 400C, and 400D (e.g., three dotted circles) of three sub-pixel stacks in the light emitting structure of FIG. 4A in accordance with an example implementation of the present disclosure. The example structures 400B-400D are example sub-pixel stacks 404 each including a first electrode layer 404a, an ETL layer 404b, an emissive layer 404c, a HTL layer 404d including a TFB layer 404d1 and a PEDOT:PSS layer 404d2, and a second electrode layer 404e. The example structures 400B-400D may substantially correspond to the example structure 100 described in FIG. 1B. Therefore, the details of the example structures 400B, 400C, and 400D are omitted for brevity.

The three example structures 400B-400D are sub-pixel stacks 404 for three color pixels (e.g., blue, green, and red pixels respectively). The distance between an emissive layer and a reflective electrode at the bottom of the emitting structure, or a thickness of the HTL layer, may be tuned such that the constructive on-axis first emission peaks 414 and the off-axis second emission peaks 416 are emitted.

In one or more implementations, the TFB layers 404d1 of the three example sub-pixel stacks 400B-400D have different thicknesses such that tuning the thickness t (e.g., $t_B$, $t_G$, and $t_R$) of each of the TFB layers 404d1 may alter the relative intensities of the first emission peak 414 and the second emission peak 416 in each of the example sub-pixel stacks 400B-400D. Therefore, the overall brightness is adjusted and color shift is reduced.

In one example implementation, the thickness $t_B$ of the TFB layer 104d1 in the example structure 400B for the blue pixel (emitting a central wavelength at about 435 nm) is about 75 nm, the thickness $t_G$ of the TFB layer 104d1 in the example structure 400C for the green pixel (emitting a central wavelength at about 530 nm) is about 115 nm, and the thickness $t_R$ of the TFB layer 104d1 in the example structure 400D for the red pixel (emitting a central wavelength at about 620 nm) is about 150 nm. In a preferred implementation, the thickness or the distance between the emissive layer and the reflective electrode is 0.53 of a wavelength for each of the blue, green, and red pixels when refractive index is considered. The offset between the distances of the preferred implementation (where distance is 0.53) and an ideal implementation (where distance is 0.78) results from the reflective electrodes used. In the example implementation, the example structures 400B, 400C, and 400D respectively shown in FIGS. 4B, 4C, and 4D vary in thickness in only one of the layers (e.g., the TFB layer 404d1) of the HTL layer 404d. However, in one or more implementations of the present disclosure, any or all layers of the HTL layer 404d may vary in thickness such that a total optical thickness is the same as the total optical thickness if only one of the HTL layer 404d changes in thickness.

Figure 5:
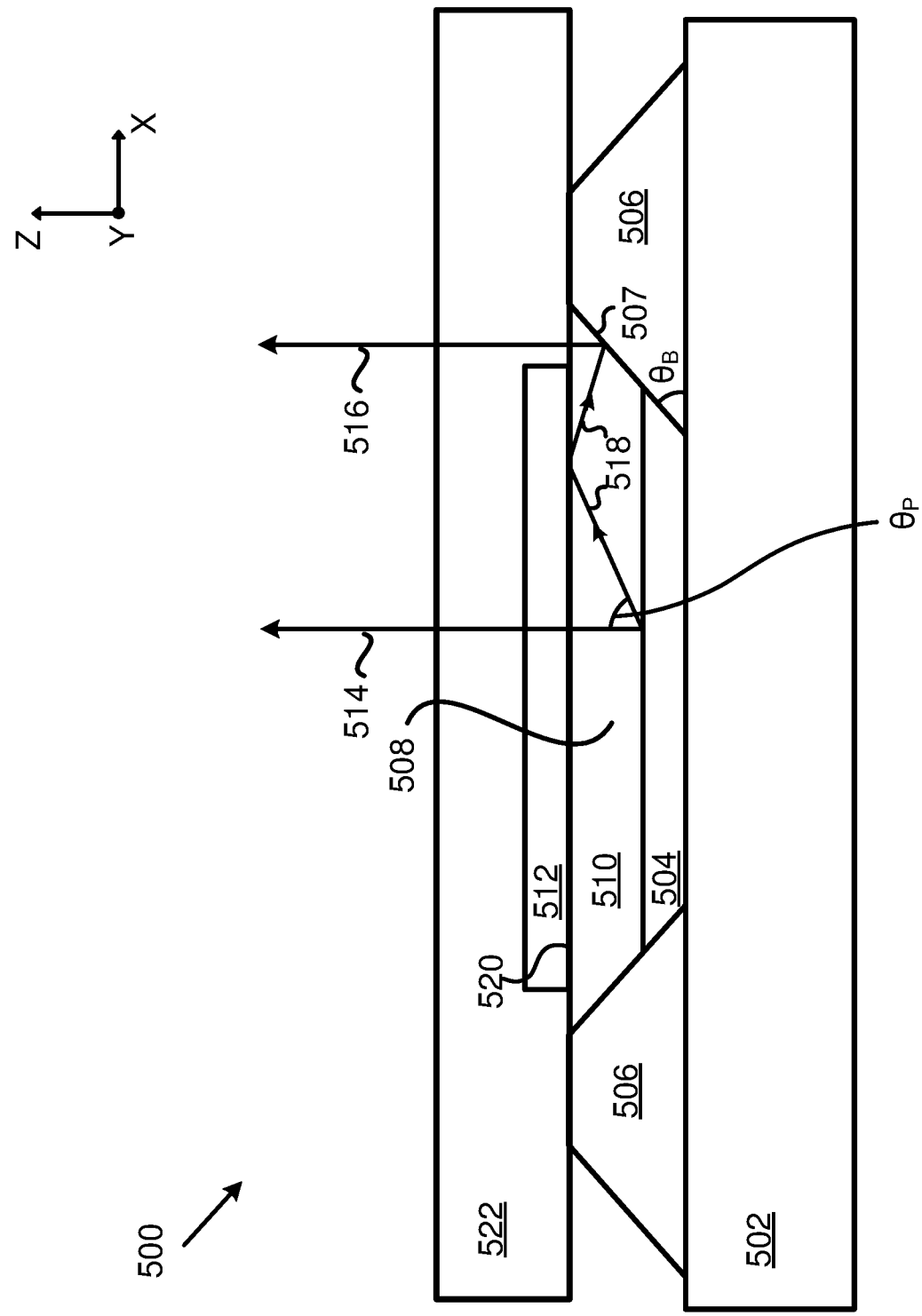
FIG. 5 is a schematic cross-sectional view of an example light emitting structure in accordance with an example implementation of the present disclosure

FIG. 5 is a schematic cross-sectional view of an example structure 500 of a light emitting structure in accordance with an example implementation of the present disclosure. The example structure 500 includes a glass substrate 502, a sub-pixel stack 504, a bank 506, a first filler material 510, a second filler material 512, and a glass cover 522. The example structure 500 may substantially correspond to the example structure 100 described in FIG. 1A. Therefore, the details of the example structure 500 are omitted for brevity.

In one or more implementations, the example structure 500 differs from the example structure 100 in FIG. 1A in that the example structure 500 has a second filler material 512 that partially covers the first filler material 510. In one or more implementations, the second filler material 512 (e.g., having lower refractive index) partially covers portions of the first filler material 510 (e.g., having higher refractive index) to reduce Fresnel reflection loss. Fresnel loss is a fractional loss where a fraction of light passing through is instead reflected. The reflected light bounces around and does not contribute to the peak brightness, thus, a fractional loss. The amount of reflected light depends on the difference in reflective indices of the filler materials 510, 512, for example, a smaller difference in refractive indices may reduce loss.

In the present implementation, the second filler material 512 covers a majority of the surface area (e.g., a plane parallel to the X-Y plane) of the first filler material 510 except for peripheral portions of the first filler material 510 immediately proximate the bank 506. Therefore, no second filler material 512 (e.g., a lower refractive index layer) are disposed immediately over the bank 506 such that Fresnel loss due to light reflected from the bank 506 may be prevented.

The first emission peak 514 may be emitted through a interface 520 along the on-axis direction in a central region of the example structure 500. The second emission peak 516 may be emitted at an off-axis direction and reflected by the interface 520 at least once via total internal reflection 518 before reaching a sloped sidewall 507 of the bank 506 and being emitted through the interface 520 along the on-axis direction at the peripheral portions of first filler material 510 immediately proximate to the sloped sidewall 507. This leads to higher efficiency, increase in on-axis brightness, and reduction in off-axis color shift at various angles.

In another implementation, the second filler material 512 may only cover a surface area substantially over a central portion of the first filler material 510. The physical arrangement(s) of the second filler material 512 with respect to the first filler material 510 is not limited to the example arrangements. The second filler material 512 may partially cover the first filler material 510 in another manner not described.

Figure 6:
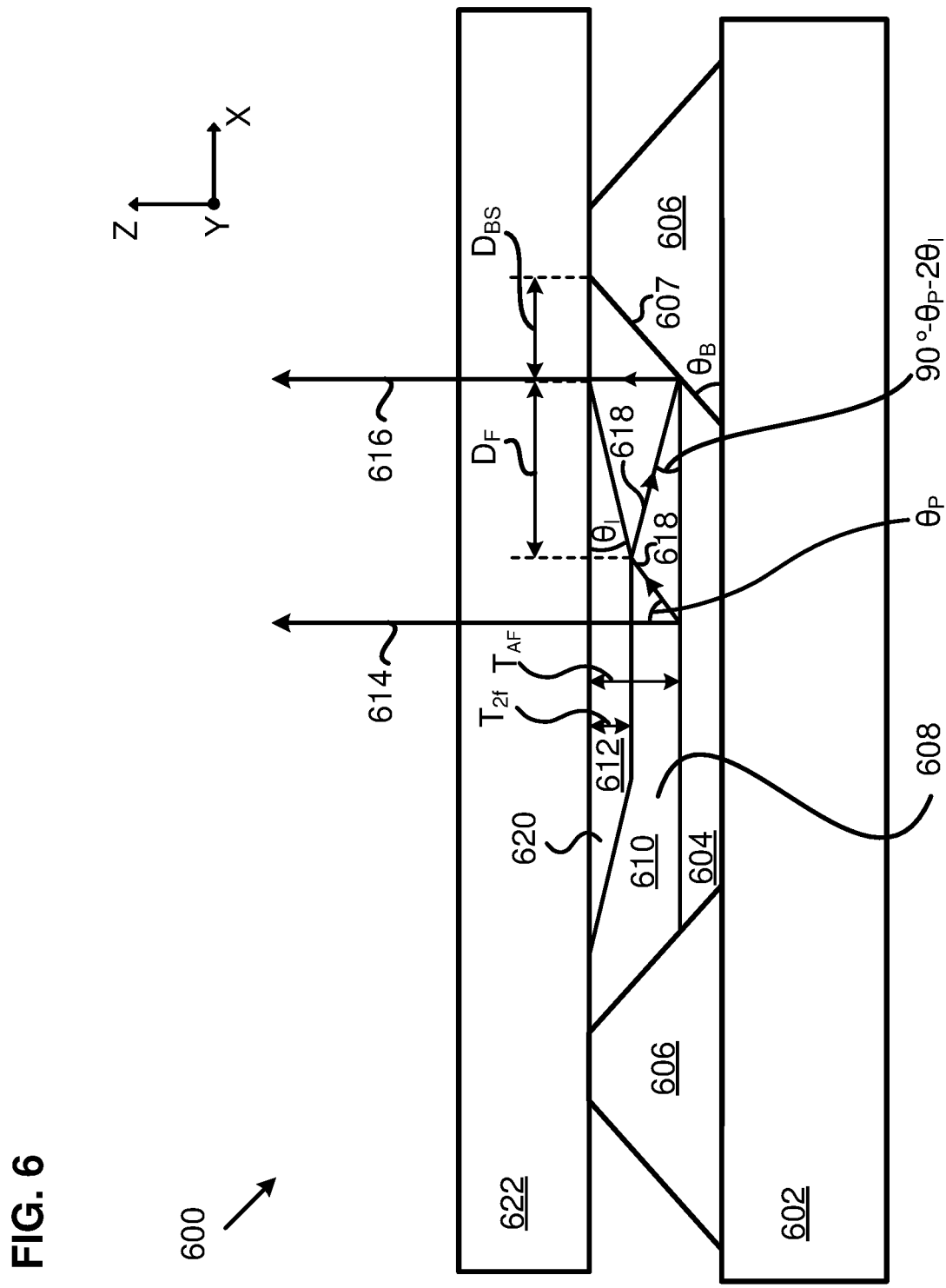
FIG. 6 is a schematic cross-sectional view of an example light emitting structure in accordance with an example implementation of the present disclosure.

FIG. 6 is a schematic cross-sectional view of an example structure 600 of a light emitting structure in accordance with an example implementation of the present disclosure. The example structure 600 includes a glass substrate 602, a sub-pixel stack 604, a bank 606, a first filler material 610, a second filler material 612, and a glass cover 622. The example structure 600 may substantially correspond to the example structure 100 in FIG. 1A. Therefore, the details of the example structure 600 are omitted for brevity.

In one or more implementations, the example structure 600 differs from the example structure 100 in FIG. 1A since the example structure 600 has a second filler material 612 that partially covers the first filler material 610, the first filler material 610 and second filler material 612 both occupy an interior space 608, and a portion of an interface 620 between the first filler material 610 and the second filler material 612 may be at an angle, specifically interface angle $\theta_I$, with reference to a top surface of the sub-pixel stack 604. A correlation between a bank angle $\theta_P$ of a sloped sidewall 607, the interface angle $\theta_I$, and an off-axis second emission peak angle $\theta_P$ with respect to an on-axis first emission peak 614 can be represented by the equation:

$$\theta_B = \theta_I + (\theta_P/2)$$ Equation (3).

In the example structure 100 in FIG. 1A, the interface angle $\theta_I$ is zero since the interface 120 between the first filler material 110 and second filler material 112 is parallel with respect to the top surface of the sub-pixel stack 104. Therefore, the Equation (3) may be reduced to $\theta_B = (\theta_P/2)$. In other words, the bank angle θB in the example structure 100 is twice the second emission peak angle $\theta_P$ in the example structure 100.

In one or more implementations, a portion of the interface 620 between the first filler material 610 and the second filler material 612 immediately proximate the sloped sidewall 607 is angled upwards towards the bank 606. In other words, a portion of the interface 620 immediately proximate to the sloped sidewall 607 is at an angle, specifically the interface angle $\theta_I$, with respect to a top surface of the sub-pixel stack 604 as shown in FIG. 6.

The interface 620 with the interface angle $\theta_I$ has a sloped surface area (e.g., a plane between the Y-Z plane and the X-Y plane). The sloped surface area of the interface 620 is where the last reflection via total internal reflection 618 of second emission peak 616 occurs before reaching the sloped sidewall 607 of the bank 606. The extent of the sloped surface area of the interface 620 depends on a distance $D_{BS}$ from a top surface of the bank 606 to the onset of the sloped surface area of the second filler material 612. In one preferred implementation, with reference to FIG. 6, a distance $D_{BS}$ correlates to a total thickness $T_{AF}$ and the bank angle $\theta_B$. The total thickness $T_{AF}$ is a sum of a thickness of the first filler material 610 (e.g., the thinnest part of the first filler material 610) and a thickness $T_{2f}$ of the second filler material 612 near the center of the first and second filler materials 610, 612. Moreover, a distance $D_F$ correlates to the thickness $T_{2f}$ and the interface angle $\theta_I$ or to the total thickness $T_{AF}$, the thickness $T_{2f}$ of the second filler material 612, the off-axis second emission peak angle $\theta_P$ with respect to the on-axis first emission peak 614, and the interface angle $\theta_I$ in the following equations:

$$D_{BS} = T_{AF}/\tan \theta_B$$ Equation (4)

$$D_F = T_{2f} * \tan(\theta_I) = (T_{AF} - T_{2f}) * \tan(\theta_P + 2\theta_I)$$ Equation (5).

By adjusting the various parameters above, the preferred bank angle $\theta_B$ may be obtained.

In one or more implementations, the bank angle $\theta_B$ may be narrow. In one preferred implementation, the bank angle $\theta_B$ is approximately 20-40° such that the bank 606 of a pixel may have a larger bank surface area (e.g., a plane of the sloped sidewall 607 between the Y-Z plane and the X-Y plane in FIG. 6) than another bank surface area with a wider bank angle. For emissive displays such as QLEDs, there is a limit to the surface brightness that can be achieved since higher surface brightness can lead to lower product life. Therefore, a narrow bank angle and high bank surface area can reduce the overall brightness while improving on-axis brightness.

In one or more implementations, after the off-axis second emission peak 616 totally and internally reflects (618) at least once against the portion of the interface 620 immediately proximate the sloped sidewall 607, the angle of the second emission peak 616 changes on its last totally internal reflection 618 resulting in the second emission peak 616 being emitted along the on-axis direction. A narrower bank angle and larger projected bank surface area provide preferred collimated performances.

In one or more implementations of the present disclosure, the top emitting structure having an ITO top transparent electrode provides a higher collimation ratio, e.g., 2.26, compared to the collimation ratio of 1, for a Lambertian source. A standard LCD backlight with brightness enhancement films has a collimation ratio of about 3 to 3.5, an OLED/QLED with a typical interior space structure (e.g., cavity structure) and a metal top electrode has a collimation ratio of about 2, and an OLED/QLED with a transparent ITO top electrode (providing better color shift and efficiency than the cavity structure) has a collimation ratio of about 1.03.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts.

As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:

1. A light emitting structure comprising:
   a substrate;
   a sub-pixel stack over a surface of the substrate;
   a bank surrounding the sub-pixel stack and forming an interior space above the sub-pixel stack;
   a first filler material in the interior space and having a first refraction index; and
   a second filler material over the first filler material and having a second refractive index lower than the first refractive index; and an interface between the first filler material and the second filler material, wherein:

the sub-pixel stack emits a first emission peak into the first filler material along an on-axis direction substantially normal to a top surface of the sub-pixel stack and emits a second emission peak into the first filler material along an off-axis direction at an angle to the on-axis direction;

the first emission peak is emitted through the interface substantially without total internal reflection;

the second emission peak is totally internally reflected by the interface before reaching a sloped sidewall of the bank; and the second emission peak is reflected by the sloped sidewall and emitted through the interface along the on-axis direction without substantial total internal reflection.

2. The light emitting structure of claim 1, wherein the sub-pixel stack comprises:

an emissive layer between a first transport layer and a second transport layer;

a first electrode layer coupled to the first transport layer; and a second electrode layer coupled to the second transport layer.

3. The light emitting structure of claim 2, wherein:

the sub-pixel stack is configured to emit light in a plurality of wavelengths having a central wavelength;

the first electrode layer is a bottom reflector having a metallic layer on the substrate;

a distance between the emissive layer and the bottom reflector is predefined so that the sub-pixel stack emits the first emission peak into the first filler material along the on-axis direction and emits the second emission peak into the first filler material along the off-axis direction.

4. The light emitting structure of claim 1, wherein an angle between the sloped sidewall of the bank and the top surface of the sub-pixel stack is one-half the angle between the on-axis direction of the first emission peak and the off-axis direction of the second emission peak.

5. The light emitting structure of claim 1, wherein:

the sub-pixel stack is configured to emit light in a plurality of wavelengths having a central wavelength; and the first emission peak is more intense than the second emission peak for wavelengths emitted by the sub-pixel stack that are shorter than the central wavelength.

6. The light emitting structure of claim 1, wherein:

the sub-pixel stack is configured to emit light in a plurality of wavelengths having a central wavelength; and the first emission peak is less intense than the second emission peak for wavelengths emitted by the sub-pixel stack that are longer than the central wavelength.

7. The light emitting structure of claim 1, wherein the second filler material covers an entire top surface of the first filler material.

8. The light emitting structure of claim 1, wherein the second filler material covers a portion of a top surface of the first filler material.

9. The light emitting structure of claim 1, wherein the interface has a sloped angle with respect to the top surface of the sub-pixel stack such that the second emission peak is reflected before reaching the sloped sidewall of the bank.

10. The light emitting structure of claim 2, wherein:

the emissive layer includes quantum dot emission material;

the first transport layer includes a hole transport layer;

the second transport layer includes an electron transport layer;

the first electrode layer is an anode layer including a metallic reflector for reflecting the light emitted from the emissive layer; and the second electrode layer is a cathode layer including a non-metallic and substantially transparent material.

11. The light emitting structure of claim 2, wherein the second refractive index is substantially the same as the first refractive index.

12. The light emitting structure of claim 2, wherein:

the first emission peak is emitted through the interface along the on-axis direction in a central region of the light emitting structure; and the second emission peak reflected by the sloped sidewall of the bank is emitted through the interface along the on-axis direction in a peripheral region of the light emitting structure.

13. The light emitting structure of claim 2, wherein:

the emissive layer includes quantum dot emission material;

the first transport layer includes an electron transport layer;

the second transport layer includes a hole transport layer;

the first electrode layer is a cathode layer having a metallic reflector for reflecting the light emitted from the emissive layer; and the second electrode layer is an anode layer having a non-metallic and substantially transparent material.

14. A display device comprising the light emitting structure of claim 1.

15. A sub-pixel structure comprising:

a sub-pixel stack including an emissive layer between a first transport layer and a second transport layer, a first electrode layer coupled to the first transport layer, and a second electrode layer coupled to the second transport layer;

a bank surrounding the sub-pixel stack and forming an interior space above the sub-pixel stack;

a first filler material in the interior space and having a first refractive index;

a second filler material over the first filler material and having a second refractive index lower than the first refractive index; and an interface between the first filler material and the second filler material, wherein:

the sub-pixel stack is configured to emit light in a plurality of wavelengths having a central wavelength;

a distance between the emissive layer and the first electrode layer is predefined so that the sub-pixel stack emits a first emission peak into the filler material along an on-axis direction substantially normal to a top surface of the sub-pixel stack and emits a second emission peak into the filler material along an off-axis direction at an angle to the on-axis direction;

the first emission peak is emitted through the interface substantially without total internal reflection;

the second emission peak is completely internally reflected by the interface onto a sloped sidewall of the bank and the second emission peak is reflected by the sloped sidewall and emitted through the interface along the on-axis direction substantially without total internal reflection.

16. The sub-pixel structure of claim 15, wherein, the first emission peak is more intense than the second emission peak for wavelengths emitted by the sub-pixel stack that are shorter than the central wavelength.

17. The sub-pixel structure of claim 15, wherein the first emission peak is less intense than the second emission peak for wavelengths emitted by the sub-pixel stack that are longer than the central wavelength.

18. The sub-pixel structure of claim 15, wherein:
the first emission peak is emitted through the interface along the on-axis direction in a central region of the sub-pixel structure; and
the second emission peak reflected by the sloped sidewall is emitted through the interface along the on-axis direction in a peripheral region of the sub-pixel structure.

19. The sub-pixel structure of claim 15, wherein the second filler material covers at least a portion of a top surface of the first filler material.

20. The sub-pixel structure of claim 15, wherein the interface has a sloped angle with respect to the top surface of the sub-pixel stack such that the second emission peak is reflected before reaching the sloped sidewall of the bank.

* * * * *